(12) United States Patent
Farah

(10) Patent No.: US 6,807,328 B2
(45) Date of Patent: Oct. 19, 2004

(54) POLISHED POLYIMIDE SUBSTRATE

(76) Inventor: John Farah, 60 Phillips St. Bld'g3 Apt. 2, Attleboro, MA (US) 02703

(*) Notice: Subject to any disclaimer, the term of this patent is extended or adjusted under 35 U.S.C. 154(b) by 0 days.

(21) Appl. No.: 10/429,080

(22) Filed: May 2, 2003

(65) Prior Publication Data

US 2004/0033006 A1 Feb. 19, 2004

Related U.S. Application Data

(63) Continuation-in-part of application No. 09/292,432, filed on Apr. 15, 1999, now Pat. No. 6,563,998.
(60) Provisional application No. 60/128,863, filed on Apr. 12, 1999, and provisional application No. 60/082,267, filed on Apr. 17, 1998.

(51) Int. Cl.[7] .............................................. G02B 6/12
(52) U.S. Cl. ....................................................... 385/14
(58) Field of Search .......................... 385/12–16, 130, 385/131, 3; 438/125

(56) References Cited

U.S. PATENT DOCUMENTS

| | | | | |
|---|---|---|---|---|
| 5,327,512 A | * | 7/1994 | Penner et al. | 385/3 |
| 5,401,687 A | * | 3/1995 | Cole et al. | 438/125 |
| 6,563,998 B1 | * | 5/2003 | Farah et al. | 385/131 |

* cited by examiner

Primary Examiner—Akm Enayet Ullah

(57) ABSTRACT

Polymer substrates, in particular polyimide substrates, and polymer laminates for optical applications are described. Polyimide substrates are polished to an average surface roughness of about 0.25 μinch, and single-layer or multi-layer waveguide structures are deposited on the polished polyimide substrates. Laminates including polymer or a hybrid organic/inorganic waveguiding film can be deposited on a polished polyimide substrate. The laminate can also include ceramic, piezoelectric and metallic layers. Optical waveguide devices are machined by laser ablation using a combination of IR and UV lasers. A waveguide-fiber coupler with a laser-machined groove for holding the fiber is also disclosed.

20 Claims, 5 Drawing Sheets

POLISHED POLYIMIDE SUBSTRATE

CROSS-REFERENCE TO RELATED PATENT APPLICATIONS

This application is a continuation in part of U.S. patent application Ser. No. 09/292,432, filed Apr. 15, 1999, now U.S. Pat. No. 6,563,998 which claims the benefit of U.S. provisional Patent Application No. 60/082,267, filed Apr. 17, 1998, and of U.S. provisional Patent No. 60/128,863, filed Apr. 12, 1999.

FIELD OF THE INVENTION

This invention relates to polished polyimide substrates and polymer laminate structures formed on those substrates, and more particularly, to polymer devices for optical and electronic applications.

BACKGROUND OF THE INVENTION

Optical waveguide devices are typically made on silicon substrates. It is desirable that materials used for optical waveguide devices exhibit certain optical, thermal and mechanical characteristics, besides low optical loss. Common silicon micromachining technologies include anisotropic chemical etching and reactive ion etching (RIE). Passive optical waveguides exhibiting acceptable losses between 0.1 and 10 dB/cm have been demonstrated in a number of materials, most notably optical grade glasses (silica) and PMMA and polystyrene polymers. The highest quality silica waveguides with very low losses of 0.1 dB/cm have been deposited on silicon wafers by the flame hydrolysis technique which yields good control over the index and thickness of the film but requires heating the porous glass layer to 1250° C. for consolidation. This high temperature perturbs the crystallographic micro-structure of silicon which affects its anisotropic chemical micromachining. Furthermore, the flame hydrolysis technique requires specialized and expensive equipment and involves the use of silane which is a toxic gas.

The fabrication of channel silica ridge waveguides requires deep RIE of several microns. Also vertical deep sidewalls and high aspect ratios, which are desirable in a micromechanical structure, such as accelerometer, can be achieved in silicon with deep RIE. However, RIE is an expensive process and requires use of high vacuum equipment which is prone to frequent failure. Furthermore, another problem with deep RIE is the erosion of the masking layer due to poor selectivity, which limits the etch depth in the silica film to the thickness of the masking layer, which is usually on the order of one micron. The selectivity of RIE can be improved with the proper selection and careful control of process parameters such as pressure and voltage. However, maintaining careful control over process parameters and finding a suitable masking material for a certain film can be limiting factors in the use of RIE.

It is desired in certain applications to incline the end faces of cantilevered film waveguides relative to the axis of the waveguide, especially at air gaps between cantilevered and fixed waveguides. This cannot be readily achieved with RIE because the electric field lines in a plasma, which define the trajectory of the energetic ions doing the etching, terminate perpendicularly to the wafer surface. Thus, the desired oblique walls at the end faces cannot be obtained with silicon micromachining technology.

Silicon micromachined cantilevers carrying film waveguides have made use of films such as silicon dioxide (silica) and nitride. However, there are problems associated with fabricating micro-structures from the bulk of silicon substrates, such as the undercutting of convex corners which alters the shape of micro-structures, e.g. the inertial mass at the end of a cantilever. This prevents the reproducible fabrication of microstructures with 90° corners such as accelerometers. This problem can be partially corrected with the use of proper corner compensation in the mask layout, however this requires significant experimentation by trial and error to determine the correct compensation for each mask design. Another problem with using silica films for waveguides in micro-mechanical applications which is not encountered in microelectronic processing is that thick films (up to 15 $\mu$m) are needed. The problem with such films is that they tend to crack and peel off due to the large residual stresses built-in during the deposition. Furthermore, the deposition of silica films is not compatible with silicon micromachining because it requires heating the wafer to a very high temperature which can affect the crystallinity of silicon on which anisotropic etching depends. Another drawback of high silica films is the necessity of deep RIE to form ridge waveguides, which is an expensive process and which is limited to etching thin films (below 1 $\mu$m) due to mask erosion.

Certain polymers have been used as waveguide materials. Low loss polymer waveguides have been most commonly achieved in poly-methyl-methacrylate (PMMA) or polystyrene. However, polymers are affected by bases such as KOH or NaOH, which are used in anisotropic chemical silicon micromachining.

The use of polyimides on silicon presents problems in regards to wet and dry etching and to the mismatch in the coefficient of thermal expansion, so that polyimide films on silicon wafers tend to have limited utility in fabricating micromachined structures for optical waveguiding applications. For optical applications it is desired to cure polyimide films at temperatures not exceeding 250° C. in order to reduce optical losses.

Polymer film waveguides that are spun cast on planar substrates exhibit thermal and optical properties that are dependent on the deposition parameters. In particular, the degree of anisotropy in the film, such as the difference between the values of the index of refraction (birefringence), and the difference between the values of the coefficient of thermal expansion (CTE) along directions that are perpendicular and parallel to the surface of the substrate, respectively, depends on the level of stress that is induced in the film due to the mismatch between the coefficients of thermal expansion of the film and substrate. For mechanical ruggedness and in order to avoid peeling off or delamination of the film, it is desired to reduce the mismatch between the in-plane CTEs of the film and substrate as this reduces the level of stress at the interface between the film and substrate. For optical and especially wave guiding applications, it is desired to reduce the birefringence of the film. The in-plane CTE of a highly anisotropic polymeric film can be made as low as 6 ppm/° C., while its out-of-plane CTE can be as high as 150 ppm/° C. The same polymeric film can be made isotropic with its in-plane and out-of-plane CTE both about 50 ppm/° C. under different deposition conditions. When polymeric films are deposited on silicon wafers for electronic applications, the in-plane CTE of the film is made to match that of silicon, which is about 5 ppm/° C. While this reduces the stresses, it creates a highly anisotropic film, which is undesirable for optical wave guiding applications. Thus, it has not been possible to simultaneously reduce the stresses and deposit a polymeric film which exhibits the lowest anisotropy and birefringence on a silicon wafer.

The residual side wall angle of a wet etched air gap or slit is unpredictable due to the swelling when a developed film dries at elevated temperatures. This is aggravated in the case of a multilayered film wherein solvent attack at the interfaces between the layers results in uneven surfaces at the end faces of the film.

When a silicon wafer carrying a polymer film is cut or cleaved, the polymer film waveguide tends to lift off the cut edge of the wafer. The width of the lifted-off regions can extend up to 300 $\mu$m inward from the edge. This necessitates removing the entire lifted region of the film, such as for example by ablating with a laser to improve coupling of light in and out of the waveguide. However, this is problematic because it creates a relatively long step that the light must traverse between edge of the wafer and edge of the film. If this step is at the input edge of the waveguide where light is focused as a cone or wedge then a substantial portion of the light can be blocked off. Whereas if the step is at the output edge then it interferes with the collection of the light by a lens for feeding into a pick up fiber. This step is particularly problematic over silicon wafers. It was necessary to control the end face of a polymer channel waveguide within 5 $\mu$m from the cleaved silicon substrate edge in order to achieve acceptable coupling of the light (J. C. Chon and P. B. Comita, "Laser ablation of nonlinear-optical polymers to define low-loss optical channel waveguides", Opt. Lett 19, 1840, 1994). The cleavage of the silicon wafer must be done very carefully so that the least amount of film is peeled off at the cleaved edges.

To couple light in and out of waveguides single mode optical fibers are typically attached to single mode channel waveguides. This requires alignment of the axes of the fiber and waveguide with submicron accuracy. For example, V-grooves can be etched in silicon substrates and the alignment between the fiber and waveguide is adjusted while actively monitoring the coupling efficiency. At the point of maximum efficiency, the fiber is attached to the substrate. It would be desirable to couple light efficiently between single mode fiber and waveguide passively without monitoring the light intensity during the attachment.

Micro-electro-mechanical (MEMS) devices are fabricated on silicon wafers either by surface micromachining of thin layers deposited on the silicon substrate, or by bulk micromachining of the MEMS structure in the substrate itself. Bulk-micromachined structures are sturdier and have higher resonant frequencies. Surface-micromachined structures are flimsier and have lower resonant frequencies. However, bulk-micromachined structures require more driving force and power to move or displace with the use of thin actuating films.

It would therefore be desirable to provide a flexible polyimide substrate and a polymer laminate wherein the materials used for the different layers are highly compatible in terms of thermal, mechanical, chemical and machining properties.

It would also be desirable to cost-effectively fabricate, for example, by laser processing in a polymer or a polymer laminate a micro-structure, for example, a micromechanical cantilevered waveguide.

It would also be desirable to couple light efficiently and passively between a single mode fiber and a single mode waveguide.

It would also be desirable to fabricate an opto-mechanical device, such as an accelerometer or optical switch incorporating a micromachined cantilevered waveguide.

It would also be desirable to fabricate a micro-mechanical device in a flexible polyimide substrate, which can be actuated with low electrical power.

SUMMARY OF THE INVENTION

This invention is directed to polished polyimide substrates for optical applications, and to polymer laminate structures fabricated using the polished substrates.

According to one aspect of the invention, a polyimide substrate has one or two polished sides with a surface roughness between about 0.25 $\mu$inch and about 100 $\mu$inch. A polymer waveguide layer can be disposed on a polished side of the polyimide substrate, with the polymer waveguide layer having a refractive index that is greater than a refractive index of the polyimide substrate and a thickness so as to support at least one guided optical waveguide mode in the polymer waveguide layer. A first polymer cladding layer can be disposed between the polyimide substrate and the polymer waveguide layer, with the first polymer cladding layer having a refractive index that is smaller than the refractive index of the polymer waveguide layer.

According to another aspect of the invention, a laminate has at least a polished polyimide substrate and a polymer or a hybrid organic/inorganic waveguiding film based on an Si—O—Si backbone deposited on the substrate.

According to another aspect of the invention, the laminate can also include a ceramic layer, preferably a piezoelectric layer, such as PZT or PLZT, or ZnO on a polished polyimide substrate.

According to another aspect of the invention, the laminate can also include metallic layers on a polished polyimide substrate.

According to another aspect of the invention, the laminate can include a polycrystalline copper-indium-gallium-diselenide (CIGS) film on a polished polyimide substrate, such as used in solar cells.

According to another aspect of the invention, a method is disclosed for forming a polymer waveguide structure on a polymer substrate. A first shape of the optical device is defined in the polymer waveguide structure using a first laser beam emitting in the IR spectral range, and a second shape of the optical device is defined in the polymer waveguide structure using a second laser beam emitting in the UV spectral range. The first laser beam separates the polymer waveguide structure at least partially from the polymer substrate, whereas the second laser beam produces a gap between the at least partially separated polymer waveguide structure and a remaining portion of the polymer waveguide so as to form a cantilevered waveguide structure. The end face of the cantilevered waveguide structure facing the gap may be perpendicular or inclined with respect to a surface normal of the polymer substrate.

In one embodiment, the first laser beam impinges in a first area on a backside of the polymer substrate opposite the polymer waveguide structure, causing ablation of the polymer substrate in the first area without ablating the polymer waveguide structure. The second laser beam impinges on the polymer waveguide structure in a second area overlapping with, but smaller than the first area, causing ablation of the polymer waveguide structure and forming an air gap, thereby forming a cantilever. The air gap releases the cantilever, allowing the released cantilever to pivot about a flexible portion located opposite the air gap.

According to yet another embodiment of the invention a method is disclosed for forming a groove in a polymer laminate which includes a polyimide substrate and an optical waveguide for coupling light between the optical waveguide and an optical fiber. The method includes directing a laser beam on the polymer laminate with a predetermined angle with respect to a surface normal of the polymer laminate and ablating the polymer laminate to form a groove substantially collinear with the optical waveguide. The groove has a bottom so that a waveguide center of the optical fiber inserted in the groove and contacting the bottom is substantially coincident with the center of the optical waveguide in a direction of the surface normal. The parameters of the ablation can be adjusted so that the sidewalls of the grooves are tapered so as to narrow from the bottom of the groove towards the optical waveguide so as to securely hold the optical fiber in the groove.

DETAILED DESCRIPTION OF CERTAIN ILLUSTRATED EMBODIMENTS

Figure 1A:
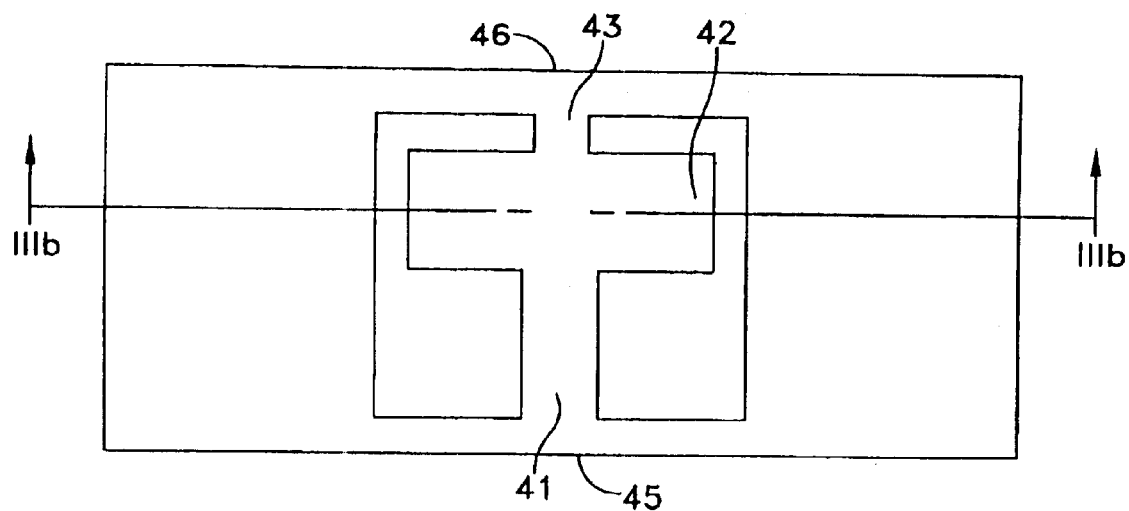
FIG. 1a shows schematically a top view of a cantilever structure before release, machined in a VESPEL® substrate using a $CO_2$ laser.

This invention provides materials and methods suitable for fabrication of a waveguide in polyimide substrate or in a polymer structure disposed on a flexible polyimide substrate. The invention also provides a micromachined cantilever supporting an optical waveguide, as well as a laser micromachining process, which allows achievement of desired waveguide end face inclination. The combination of materials disclosed herein achieves advantageous optical, mechanical, processing and thermal properties.

This invention uses excimer laser ablative micromachining as a replacement for chemical etching of micro-electro-mechanical systems (MEMS) and opto-micro-electro-mechanical systems (OMEMS). This process is cost-effective and avoids wet development in the fabrication of micro-structures which can result in distortion of film waveguides due to swelling of the film in the presence of a solution.

Polyimide substrates suitable for use in this invention are flexible with a modulus of elasticity ranging between 1 and 10 GPa. These polyimide substrates are generally at least 200 $\mu$m thick, but thinner membranes can be used. The polyimide material can preferably withstand temperatures such as those encountered in polishing without significant degradation of the physical and mechanical properties. The surface of the polyimide material can be polished to achieve a surface roughness in the range between about 0.25 $\mu$inch and about 100 $\mu$inch. VESPEL® is a suitable polyimide material commercially available from DuPont, which can be machined into a suitable substrate and which can operate continuously from cryogenic temperatures to 288° C. in air, to 315° C. in inert environments or vacuum, and can withstand temperatures up to 482° C. for short durations. It is tough yet compliant, which makes it suitable for a flexible substrate. Because of its inherent mechanical strength, stiffness and dimensional stability at machining temperatures, VESPEL® can be machined with the use of standard metalworking equipment. It can also be ground, buffed, polished and lapped. The thickness of a polished wafer can vary along the radius.

VESPEL® is a mechanically sturdy, visually opaque, brown colored polyimide which is available commercially in the form of circular discs with diameters varying between about 2 inch and about 4 inch, and thickness of about 0.25 inch. These disks are too thick to be used as wafers. In the present invention VESPEL® polyimide is cut from bulk cylinders with a wire and polished to form wafers or substrates, on which films are deposited. VESPEL® wafers of any thickness are obtained by cutting and polishing the VESPEL® discs. The thickness of the wafer can vary along the radius. For example, the inner portion around the center of the wafer can be thin as a membrane while the outer portion near the perimeter of the wafer can be thicker as a ring, or vice versa. VESPEL® polyimide is also available in other forms, such as rods, plates, plaques, and bars, which can be used to form substrates. VESPEL® bulk forms which are made from either SP, SCP or ST polyimide resins can be used to form substrates useful for this invention. The SCP resin has a water absorption coefficient of about 0.08% by weight in a 100% relative humidity environment.

VESPEL® discs about 2 inch in diameter and about 0.25 inch thick were sliced to form thin wafers having a thickness of about 300 $\mu$m, 500 $\mu$m, 625 $\mu$m, 750 $\mu$m, 875 $\mu$m, 900 $\mu$m, and 1 mm. VESPEL® discs about 4 inch in diameter were sliced to form thin wafers having a thickness of about 750 $\mu$m The wafers were subsequently polished on both sides to an average surface roughness of about 0.25 $\mu$inch. This yielded flat Vespel wafers with uniform thickness and reflective surfaces ready for film deposition. Polishing of the Vespel surface improved the reflectivity significantly. Vespel wafers can be polished to an average surface roughness of 0.025 $\mu$inch with the use of chemical mechanical polishing (CMP).

VESPEL® wafers, which were thicker than about 1 mm were lapped and polished on one side to make it reflective and capable of accepting a waveguiding film on the reflective surface. These thicker wafers remained flat after polishing. This yielded VESPEL® wafers that were planar, smooth and highly reflective.

Laminate waveguide structures were deposited on polished VESPEL® substrates using organic materials, in particular polyimide films, with a glass transition temperature greater than 200° C., and having a thickness of between 0.1 $\mu$m and 15 $\mu$m. Deposition methods include, for example, spinning, dipping, spraying, coating, or gluing. Polymeric waveguides can be spun cast from solutions directly onto the substrate, or obtained as free-standing films which can be glued onto the substrate. Suitable waveguide materials that can be deposited on polished VESPEL® substrates are perfluorinated polymers, such as perfluorocyclobutane (PFCB); halogenated acrylates, such as PMMA; fluorinated and non-fluorinated polyimides; and hybrid organic/inorganic compounds, such as spin-on glasses that are deposited with the use of the solgel process. The waveguides can be photo-imageable, which are formed by development after exposure to UV light, or without material removal by the introduction of certain dopants whose index of refraction changes after exposure to UV light; or non-photoimageable, which are formed by wet or dry etching.

Polyguide™ films, manufactured by DuPont in Wilmington, Del., contain low molecular weight acrylate and methacrylate monomers. These monomers diffuse within a polymer binder matrix and polymerize when exposed to UV light thereby changing the index of refraction of the polymer. Waveguides and in particular single mode waveguides are fabricated by photochemical polymerization of the monomers with the use of laser writing or photolithography. Channel waveguides can be fabricated in Polyguide sheets, without etching or material removal, by exposing it selectively through a mask to UV radiation. Several meters long single or multimode waveguides can be fabricated in Polyguide polymer sheets or rolls. Freestanding polyguide sheets can then be cut and glued onto VESPEL® wafers.

This laminate has at least a polished polyimide substrate and a polymer or a hybrid organic/inorganic waveguiding film based on an Si—O—Si backbone deposited on the substrate. An optional optical buffer layer can be used to separate the waveguiding film from the polyimide substrate, and an optional upper cladding layer can be used on top of the waveguiding film. Each layer has a thickness in the range specified above. The laminate demonstrates compatibility of the mechanical, thermal, chemical and optical properties of all the layers and specifically closeness of the coefficients of thermal expansion of the layers in the laminate, which minimizes residual stresses. The deformation and warpage of the laminate and the delamination and/or cracking of the film are thus reduced when subjected to baking cycles.

The laminate can also include a ceramic layer, preferably a piezoelectric layer, such as PZT or PLZT, or ZnO on a polished polyimide substrate. The flexibility of the polyimide substrate allows the thin piezoelectric layer to bend the substrate with reasonable applied voltages that are compatible with commonly available driving circuits. This allows a MEMS structure, such as a micromachined cantilever, which can be as thick as the substrate itself, to be actuated by a thin piezoelectric layer deposited on top of the polyimide substrate. The ceramic layer can be deposited between the polished polyimide substrate and the wave-guiding film, or it can be deposited on top of the wave-guiding film.

The laminate can also include metallic layers on a polished polyimide substrate. The metallic layers can be made of aluminum (AL), copper (Cu), gold (Au), silver (Ag), titanium (Ti), nickel (Ni). The metallic layers can be deposited either by sputtering, evaporation, electroplating or electroless plating. Each layer has a thickness in the range specified above.

The laminate can include a polycrystalline copper-indium-gallium-diselenide (CIGS) film on a polished polyimide substrate, such as used in solar cells.

It is necessary to prepare the input and output end faces of waveguiding films on VESPEL® substrates to couple light in and out of the waveguide, and to prepare the air gap between a cantilevered waveguide and a fixed waveguide. The input and output end faces can be polished, such as for example by dicing with a diamond blade, whereas the narrow air gap of only a few microns between two waveguide end faces can be fabricated by laser ablation. The input and output end faces are also ablated. However, the dicing technique can be more cost-effective for preparing the input/output edges of the film.

For precise micromachining, such as the fabrication of an air gap between two waveguides and for preparation of input and output end faces of waveguiding films, a light source whose spot size can be focused to below 10 $\mu$m, such as for example an excimer laser is used. This produces smooth edges and reduces scattering of the light. Polymer materials absorb at UV wavelengths, therefore any laser whose emission frequency falls in the range between about 360 nm and about 180 nm, or whose frequency can be doubled or tripled or quadrupled to yield a wavelength in that range, and whose spot size can be focused to below 10 $\mu$m to yield smooth ablated edges can be used. However, for the fabrication of the boundaries of micro-mechanical structures where light does not cross, or for etching holes throughout the thickness of the substrate, an IR laser, such as a $CO_2$ or YAG laser which etch polymer materials faster than the excimer laser, can be used. The edge quality of the cut of the IR laser can be improved with the use of a short pulse high-energy laser such as a Q-switched $CO_2$ laser. The quantity of debris released by ablation can be reduced with the use of special coatings.

To produce a cantilever beam, a cut is advantageously produced through the thickness of a VESPEL® wafer, for example, using a pulsed $CO_2$ laser, although a cantilever beam can be fabricated entirely using an excimer laser. The pulse width of the $CO_2$ laser beam is at least about 0.5 ms. The $CO_2$ laser beam is controlled by a computer which stores AutoCad data representing the contour of the cantilever. The cantilever contour was formed in a single traversal of the wafer by the laser beam.

The minimum spot size achievable with a typical $CO_2$ laser is typically at least about 50 $\mu$m, which tends to produce ragged edges in the waveguide film and the micro-machined cantilever. However, smoother edges can be obtained with the use of a Q-switched $CO_2$ laser Most of the cantilever shape is fabricated with the $CO_2$ laser, except for a narrow region at the location where the air gap is formed by excimer laser ablation. The narrow region in the VESPEL® wafer can be ablated with excimer laser concurrently with the formation of the air gap. The $CO_2$ laser does not release the cantilever completely but keeps it suspended from the narrow region. Ablation of the air gap in the organic film and concurrent ablation of the VESPEL® material underneath it releases the cantilever, which then can freely move due to acceleration or applied force.

The procedure for releasing the cantilever and forming the air gap utilizes two consecutive steps:

(i) ablating from the uncoated back surface of the VESPEL® wafer to a depth short of ablating through the whole thickness of the wafer and a width larger than the desired width of the air gap, and (ii) ablating from the side carrying the waveguide film to the remaining depth of the wafer and a width equal to the desired air gap. To accommodate a larger tolerance in the placement of the air gap within the ablated area across the visually opaque VESPEL® wafer, the area ablated from the uncoated back side of the wafer is made wider than the desired air gap width.

It is preferred that the step of $CO_2$ laser cutting precede the dicing and excimer laser ablation steps. It is also preferred that the last step in the fabrication process be the ablation step.

Accordingly, the fabrication of a cantilever includes: cutting the shape of the cantilever with $CO_2$ laser without releasing it, ablating the narrow region of the VESPEL® wafer with excimer laser and ablating the air gap concurrently to release the cantilever, and ablating the input/output edges of the waveguide film with an excimer laser, not necessarily in this order.

EXAMPLE 1

Laser Micromachined Cantilever Beam with Ablated Input/Output Edges

A cantilevered waveguide was fabricated in a polished VESPEL® wafer according to the procedure outlined above by following the sequential steps of:

(a) forming an unreleased cantilever contour by cutting the VESPEL® wafer with a $CO_2$ laser, (b) ablating the input/output edges of the waveguide film with an excimer laser, and (c) ablating the narrow region of the VESPEL® wafer with the excimer laser and ablating the air gap concurrently to release the cantilever.

Figure 1D:
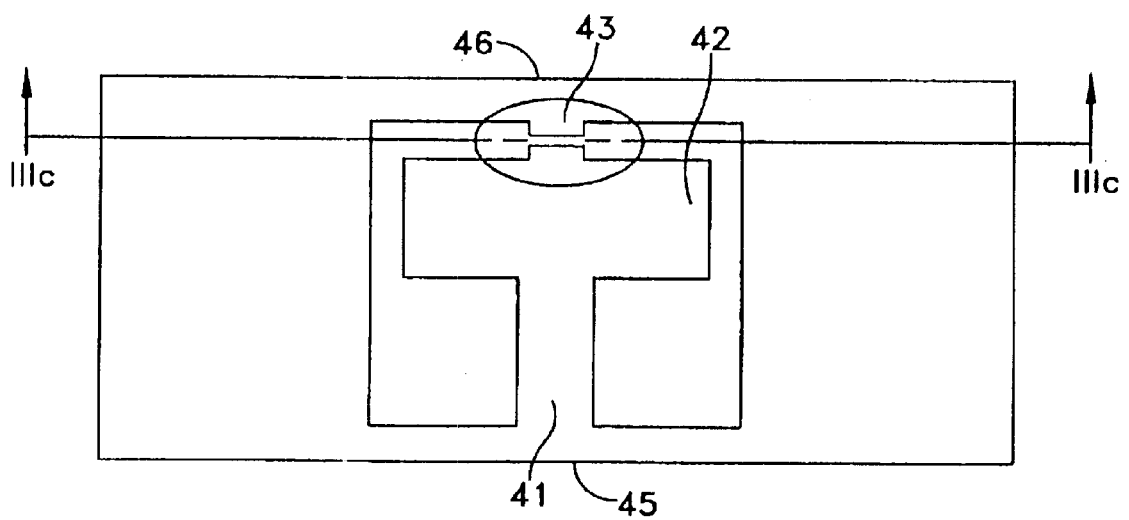
FIG. 1d shows schematically a top view of the cantilever structure of FIG. 1a after release by ablation of the gap with an excimer laser.
Figure 1B:
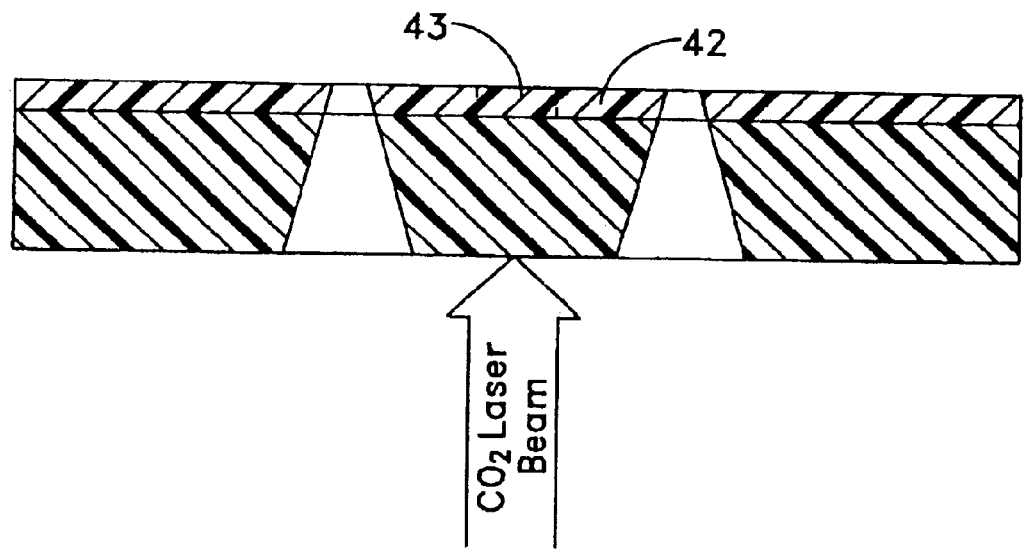
FIG. 1b shows schematically a cross-sectional view of the cantilever structure of FIG. 1a taken along the line IIIb—IIIb.
Figure 1C:
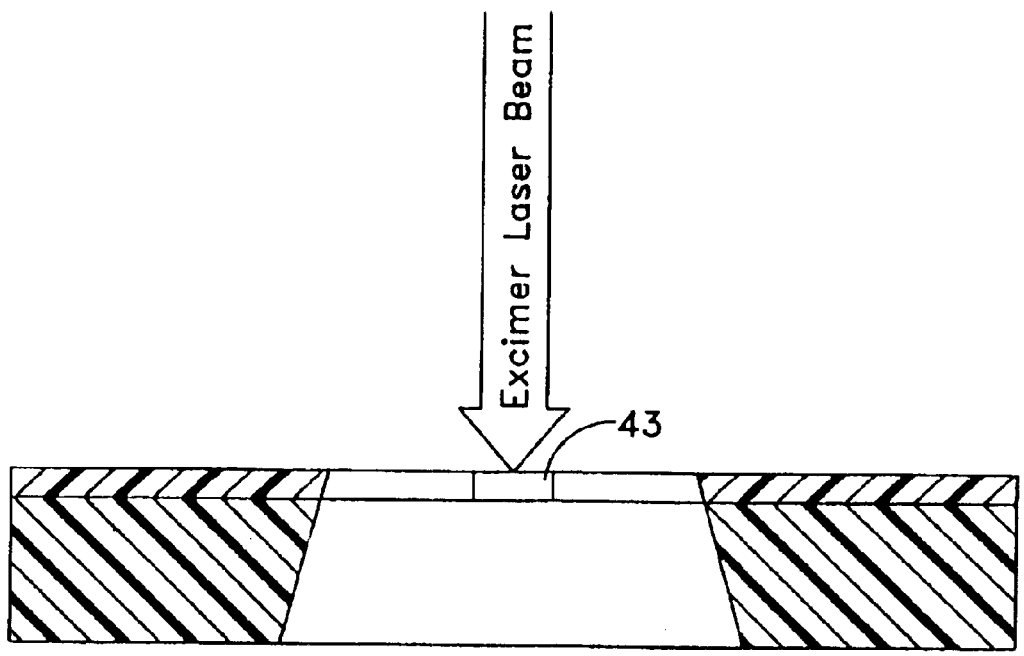
FIG. 1c shows schematically in cross section ablating with an excimer laser a gap for releasing the cantilever structure of FIG. 1a, with the cross section taken along the line IIIc—IIIc of FIG. 1d.

The cantilevered waveguide of example 1 is shown schematically in FIGS. 1a–1d. The polished VESPEL® wafer is 25 mils (625 μms) thick. The line drawings were prepared from an SEM image. The main cantilever section denoted by 41 in FIGS. 1a and 1d is 50 mils long by 25 mils wide. The area 42 representing the inertial mass is 110 mils long by 70 mils wide. As indicated in FIG. 1b, a $CO_2$ laser creates most of the contour of the cantilever except for a narrow— approximately 10 mils wide—region 43 at the location where the air gap is subsequently to be formed by excimer laser ablation, as indicated in FIG. c. As before, the $CO_2$ laser does not release the cantilever at the narrow region 43, but keeps it suspended from the narrow region 43. The input edge of the waveguide film is denoted by 45 and the output edge of the waveguide film is denoted by 46.

After formation of most of the contour of the cantilever (except the narrow region) by $CO_2$ laser cutting, the PEV wafer #1 is ablated from the uncoated back surface to a depth of 550 μm and width of 50 μm at region 43. The PEV wafer is then ablated from the waveguide-side to a depth of 75 μm and a width equal to that of the desired air gap. The cantilever is released by concurrently ablating the air gap in the region 43 of the waveguide film and the VESPEL® material underneath. The air gap or pick up fiber or waveguide, i.e. the portion of region 43 adjacent to the ablated air gap, in FIG. 1d may not be necessary.

Figure 2:
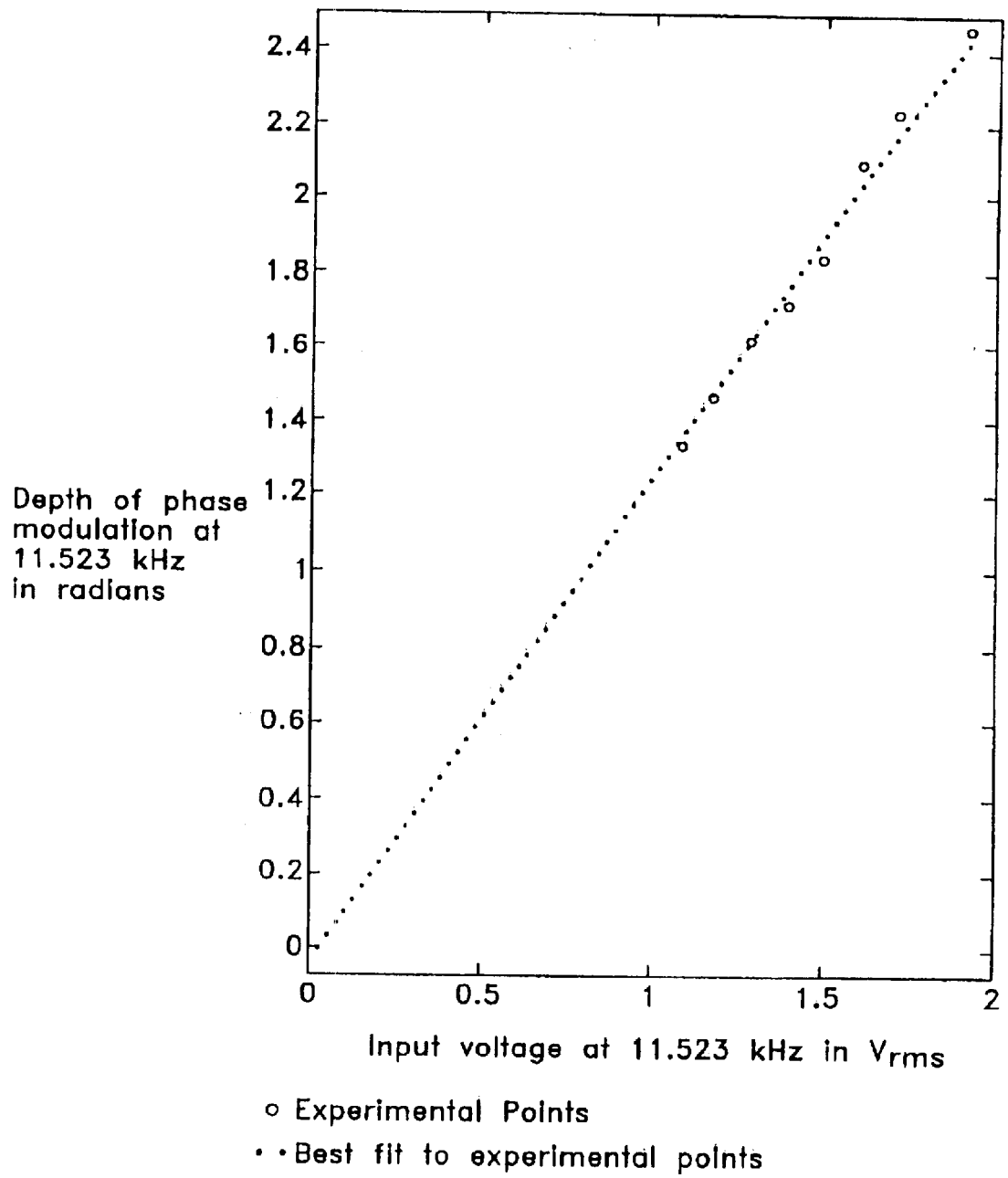
FIG. 2 is a schematic diagram of a phase modulation in radians vs. RMS drive voltage applied to a piezoelectric plate.

The displacement of the cantilever is measured interferometrically. The displacement of the cantilever causes a phase change in the optical path of the light passing through the cantilever waveguide. In an exemplary measurement, a section of straight planar waveguide incorporating a micromachined cantilever is inserted in one arm of a fiber optic Mach-Zehnder interferometer. The cantilever is driven with a piezoelectric sheet made from PZT material to simulate acceleration. The piezoelectric plate is driven longitudinally near its resonance to attain maximum displacement. The resonant frequency of the piezoelectric plate was measured to be 11.523 kHz. Application of a sinusoidal voltage to the piezoelectric plate generated dynamic displacements of the cantilever, which were picked up as optical phase change by the interferometer. FIG. 2 displays a graph of the phase change in radians resulting from the displacement of the cantilevered waveguide vs. the voltage applied to the piezoelectric sheet. A linear fit to this plot provided the value of the phase shifting coefficient, which is defined as the phase modulation depth per unit voltage expressed in rad/V. A value of 1.281 rad/$V_{rms}$ was determined at f=11.523 kHz, corresponding to an optical path length change of 0.127 μm per μm of lateral cantilever tip displacement.

EXAMPLE 2

Laser Micromachined Cantilever Beam with Diced Input/Output Edges

A cantilevered waveguide similar to that given above in Example 1 was fabricated in a polished VESPEL® wafer, except that the input/output edges of the waveguide film in step (b) were diced instead of laser-ablated (not shown).

The cantilevered waveguide of Examples 1 and 2 can be used, for example, in an interferometric optical accelerometer, or in a optical switch for muting of light in optical telecommunications networks.

Figure 3:
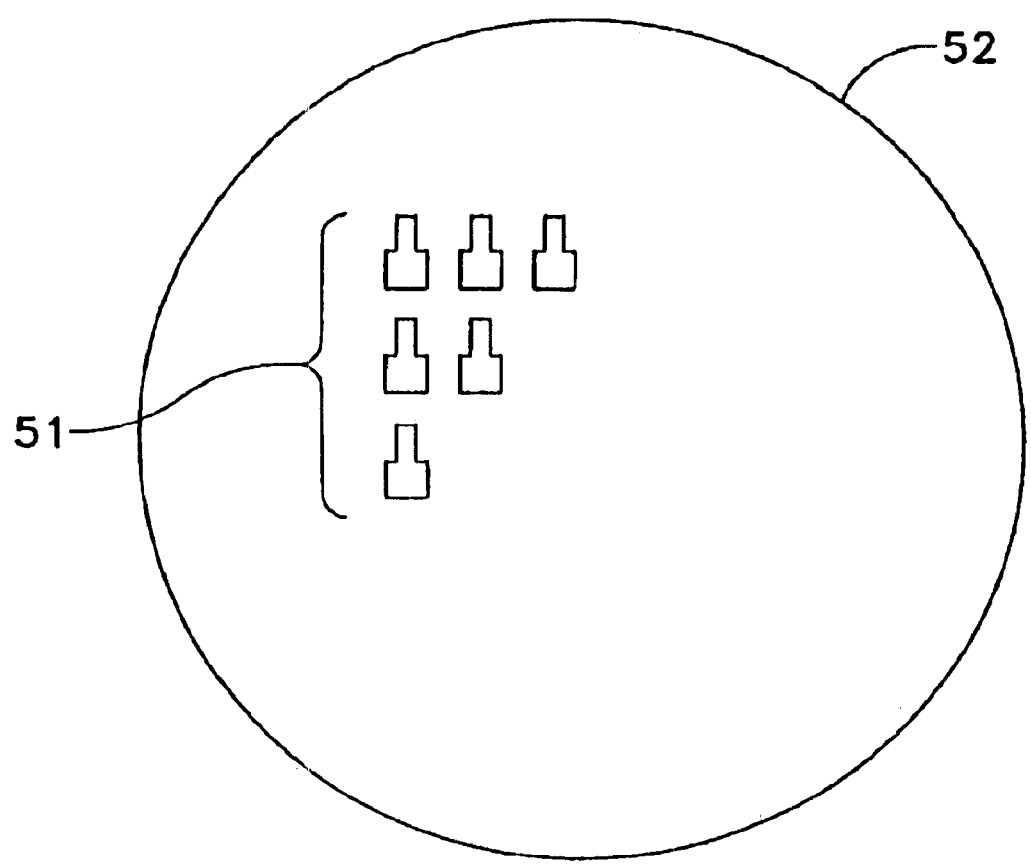
FIG. 3 shows schematically a pattern of cantilevers cut in a polished VESPEL® wafer using a $CO_2$ laser.

FIG. 3 shows a pattern of adjacent cantilevers 51 cut with a $CO_2$ laser in a polished VESPEL® wafer 52. This demonstrates that $CO_2$ laser cutting is suitable to produce a large number of cantilevered devices simultaneously on a single substrate and hence is suitable for large scale production.

EXAMPLE 3

Fabrication of a Groove for Mounting a Fiber

Figure 4:
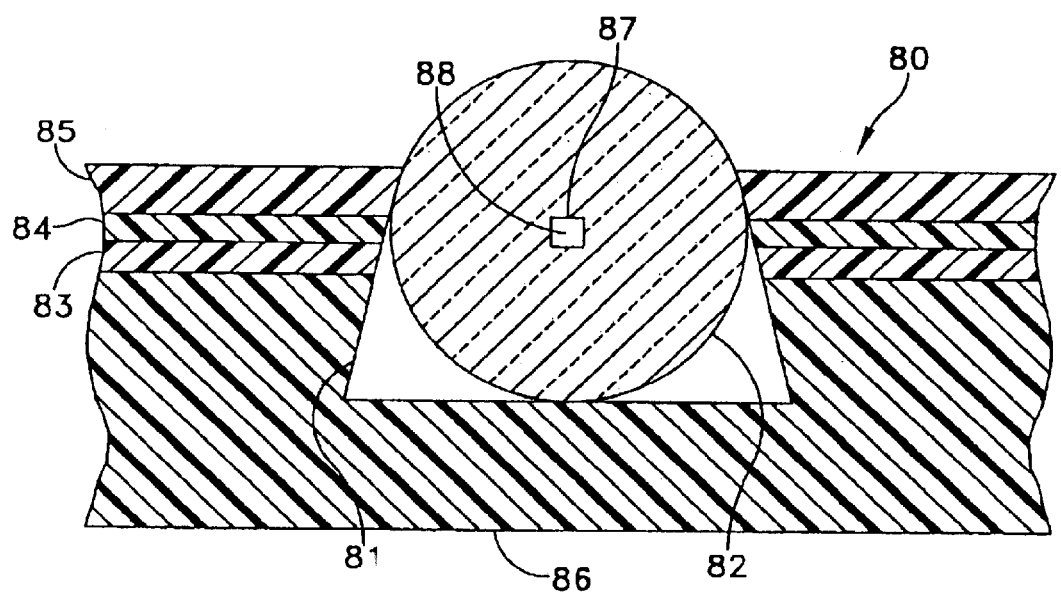
FIG. 4 shows schematically a cross-sectional view of an optical fiber located in a groove laser-machined in a polyimide/polymer laminate.

A groove is fabricated in the organic laminate by laser ablation. The groove is parallel and colinear with the channel waveguide. The end of the channel waveguide at the groove is prepared by laser ablation. The fluence of the ablating laser and the optical delivery system can be adjusted to yield a natural undercut in polymers in the form of an inverted V-groove which enables the groove to hold the fiber tightly both horizontally and vertically. An optical fiber is inserted in the groove by pressing. It is translated axially until its tip contacts the end of the waveguide. The depth and width of the groove can be controlled very precisely by controlling the number of pulses of the laser so that the fiber core is located at the vertical level of the waveguide which is deposited on the surface of the substrate, preferably a VESPEL® substrate. The accuracy of the vertical alignment between fiber and waveguide depends on the accuracy with which the groove depth can be controlled. This is very precisely known from knowledge of the ablation rate of the substrate material in μm/pulse, the repetition rate of the pulses and the fluence of the laser, i.e. energy per pulse. For example, if the waveguide core layer is centered at a distance of about 10 μm above the substrate surface, then assuming a fiber radius of 62.5 μm, the bottom of the groove must be at a distance of 52.5 μm below the substrate surface. At a rate of approximately 1 μm/pulse, it would take about 50 pulses to form the groove. The accuracy of the horizontal alignment between fiber and waveguide depends on the accuracy with which the groove width and location can be controlled. This is very precisely controlled with the use of standard photolithographic processes. This yields the desired accuracy for coupling between single mode fibers and waveguides. A cross section of a polymer laminate 80 comprising a groove 81, fiber 82, and waveguide comprising a first optical buffer (lower cladding) layer 83, a second optical waveguiding (core) layer 84, and a third optical (upper cladding) layer 85 on top of a substrate 86 is shown in FIG. 4. The center of the channel waveguide 87 in the core layer 84 coincides with the center of the fiber 88. The upper cladding layer 85 of the polymer laminate 80 grips the fiber 82 above its horizontal diameter and exerts a downward force on the fiber which holds it in place. The groove can be fabricated in the organic laminate with the use of laser ablation either by direct writing or by imaging through a reticle. Furthermore the groove can be fabricated with an excimer laser, which emits pulses which are typically on the order of nanoseconds long. Alternatively, the groove can be fabricated with lasers, which emit picosecond or femtosecond pulses for a more precise control of the groove dimensions.

The foregoing is considered only illustrative of the currently preferred embodiments of the invention presented herein. Since numerous modifications and changes may occur to those skilled in the art, it is not desired to limit the invention to the exact construction used to illustrate the various means comprising the invention.

What is claimed is:

1. A substrate for a circuit structure comprising:
   a planar substrate mass of polyimide material having a first side and a second side, said first side being polished to a surface smoothness between about 0.025 μinch and 0.5 μinch, capable of receiving a circuit structure.

2. The substrate for a circuit structure of claim 1, wherein said surface smoothness is between about 0.25 μinch and 0.5 μinch.

3. The substrate for a circuit structure of claim 1, further comprising a first layer applied to said first polished side of said planar substrate mass, a second layer applied over said first layer, a third layer applied over said second layer, wherein the index of refraction of said second layer is greater than the index of refraction of said first layer and said third layer.

4. The substrate for a circuit structure of claim 3, wherein said first layer, said second layer and said third layer are hybrid organic/inorganic compounds.

5. The substrate for a circuit structure of claim 4, wherein said hybrid organic/inorganic compounds are based on Si—O—Si bond.

6. The substrate for a circuit structure of claim 4, wherein said hybrid organic/inorganic compounds are fluorinated.

7. The substrate for a circuit structure of claim 4, wherein said hybrid organic/inorganic compounds are applied to said first polished side of said planar substrate mass using a solgel process.

8. The substrate for a circuit structure of claim 4, wherein said polyimide substrate and said hybrid organic/inorganic compounds have coefficients of thermal expansion between about $50 \times 10^{-6}/°$ C. and $75 \times 10^{-6}/°$ C.

9. The substrate for a circuit structure of claim 1, further comprising a polymer layer, wherein said polymer layer is a freestanding layer glued to said first polished side of said planar substrate mass.

10. The substrate for a circuit structure of claim 1, further comprising a first metallic layer applied to said first polished side of said planar substrate mass.

11. The substrate for a circuit structure of claim 10, further comprising a second metallic layer applied over said first metallic layer.

12. The substrate for a circuit structure of claim 11, further comprising a piezoelectric layer between said first metallic layer and said second metallic layer.

13. The substrate for a circuit structure of claim 12, wherein said piezoelectric layer is PZT.

14. The substrate for a circuit structure of claim 13, wherein said PZT layer is deposited on said planar polyimide substrate using a solgel process.

15. The substrate for a circuit structure of claim 12, wherein said polyimide substrate, said first metallic layer, said piezoelectric layer and said second metallic layer are cut to form at least one cantilever member having a connected end and a free end opposite said connected end.

16. The substrate for a circuit structure of claim 12, further comprising a first layer applied to said second metallic layer, a second layer applied over said first layer, a third layer applied over said second layer, wherein the index of refraction of said second layer is greater than the index of refraction of said first layer and said third layer.

17. The substrate for a circuit structure of claim 16, wherein said first layer, said second layer, and said third layer are hybrid organic/inorganic compounds.

18. The substrate for a circuit structure of claim 4, further comprising a first metallic layer applied to said third hybrid organic/inorganic layer, a piezoelectric layer applied to said first metallic layer, and a second metallic layer applied to said piezoelectric layer.

19. A method of preparing a substrate for a circuit structure comprising:
   providing a planar substrate mass of polyimide material having a first side and a second side; and
   polishing said first side to a surface smoothness between about 0.025 μinch and 0.5 μinch.

20. A method of forming a groove having a precise depth and width in a planar substrate mass of polyimide material comprising:
   providing a planar substrate mass of polyimide material having a first side and a second side;
   polishing said first side to a surface smoothness between about 0.025 μinch and 0.5 μinch; and
   cutting said first side of said planar substrate mass using a pulsed laser, said pulsed laser outputting a predetermined number of pulses to form a groove having a depth and a width capable of receiving an optical fiber.

* * * * *